(12) United States Patent
Feng et al.

(10) Patent No.: US 7,456,114 B2
(45) Date of Patent: Nov. 25, 2008

(54) MICROETCHING COMPOSITION AND METHOD OF USING THE SAME

(76) Inventors: Kesheng Feng, 269 Spruce St., Cheshire, CT (US) 06410; Nilesh Kapadia, 71 Coram Rd., Shelton, CT (US) 06484; Steven A. Castaldi, 134 Farmstead La., Torrington, CT (US) 06790

( * ) Notice: Subject to any disclaimer, the term of this patent is extended or adjusted under 35 U.S.C. 154(b) by 170 days.

(21) Appl. No.: 11/316,010

(22) Filed: Dec. 21, 2005

(65) Prior Publication Data

US 2007/0138142 A1    Jun. 21, 2007

(51) Int. Cl.
C09K 13/00    (2006.01)
C09K 13/04    (2006.01)

(52) U.S. Cl. .................. 438/745; 438/754; 252/79.1; 252/79.2; 252/79.3; 252/79.4; 216/93; 216/105; 216/106

(58) Field of Classification Search .......... 438/745, 438/754; 252/79.1, 79.2, 79.3, 79, 4; 216/93, 216/105, 106

See application file for complete search history.

(56) References Cited

U.S. PATENT DOCUMENTS

| | | | |
|---|---|---|---|
| 3,966,473 A | 6/1976 | Sato | |
| 4,221,674 A | 9/1980 | Vander Mey | |
| 4,466,859 A | 8/1984 | Nelson | |
| 5,243,320 A | 9/1993 | Clouser et al. | |
| 5,509,557 A | 4/1996 | Jimarez et al. | |
| 5,532,094 A | 7/1996 | Arimura et al. | |
| 5,807,493 A | 9/1998 | Maki et al. | |
| 5,965,036 A * | 10/1999 | Maki et al. ............... | 216/106 |
| 6,086,779 A * | 7/2000 | Bishop et al. ............. | 216/93 |
| 6,372,027 B1 | 4/2002 | Tomaiuolo et al. | |
| 6,426,020 B1 | 7/2002 | Okada et al. | |
| 2002/0056702 A1* | 5/2002 | Bishop et al. ............. | 216/90 |
| 2003/0027430 A1* | 2/2003 | Stevens et al. ........... | 438/754 |
| 2004/0099343 A1* | 5/2004 | Ferrier .................... | 148/248 |
| 2005/0112369 A1 | 5/2005 | Ibbitson et al. | |
| 2008/0041824 A1* | 2/2008 | Feng et al. ............... | 216/108 |

FOREIGN PATENT DOCUMENTS

EP    1 037 513 A2    9/2000

* cited by examiner

*Primary Examiner*—Duy-Vu N Deo
(74) *Attorney, Agent, or Firm*—Carmody & Torrance LLP

(57) ABSTRACT

The present invention is directed to a microetching composition comprising a source of cupric ions, acid, a nitrile compound, and a source of halide ions. Other additive, including organic solvents, a source of molybdenum ions, amines, polyamines, and acrylamides may also be included in the composition of the invention. The present invention is also directed to a method of microetching copper or copper alloy surfaces to increase the adhesion of the copper surface to a polymeric material, comprising the steps of contacting a copper or copper alloy surface with the composition of the invention, and thereafter bonding the polymeric material to the copper or copper alloy surface.

32 Claims, 2 Drawing Sheets

MICROETCHING COMPOSITION AND METHOD OF USING THE SAME

FIELD OF THE INVENTION

The present invention relates to microetching compositions useful for treating metal surfaces, such as copper and copper alloy surfaces, in the manufacture of printed circuit boards.

BACKGROUND OF THE INVENTION

Printed circuits containing one or more circuitry innerlayers are in prominent use today as demand increases for further and further weight and space conservation in electronic devices.

Successful fabricating of multi-layer printed circuit boards requires bonding together of copper and resin layers. However, direct bonding of copper and resin layers does not always provide sufficient bonding strength. It is therefore common to improve copper-resin bonding strength by providing surface roughness to the copper surface, whereby mechanical bonding between the copper and the resin layers can be enhanced. Surface roughness may be provided by mechanical cleaning, using a buffing or scrubbing machine, or by chemical cleaning.

In one method of chemical treatment, surface roughness is provided to the copper surface by depositing an oxide layer on the copper surface, such as cuprous oxide, cupric oxide, or the like. Formation of the oxide layer, which turns the pink copper surface a brown-black color, creates minute unevenness on the copper surface which provides an interlocking effect between the copper surface and resin, thus improving the bond strength.

Another method for improving the adhesion of dielectric material to a copper circuit trace uses a microetching technique. In microetching, no portion of copper, e.g., copper circuitry traces, is completely etched away. Instead, the surface is etched (or oxidized) only to a limited extent so as to leave intact the original pattern of the copper being etched. Typically, the surface of the copper is etched only to a depth of between about 20 and about 500 micro-inches, as measured from the original surface to the depths of the microetching. This is accomplished by choosing an appropriate microetching composition and limiting the extent of etching according to the parameters of the etching solution (e.g., concentration, temperature, composition, etc.).

Microetching solutions may be composed of hydrogen peroxide and an inorganic acid, such as sulfuric acid and phosphoric acid. However, these compositions can be unstable due to decomposition of the hydrogen peroxide, which results in fluctuations in the etching rate, discoloration of metals other than copper, and other problems.

Another type of microetching solution utilizes a cupric ion source, an organic acid, and a halide ion source, as described for example in U.S. Pat. No. 6,426,020 to Okada et al. and U.S. Pat. No. 5,807,493 to Maki et al., the subject matter of each of which is herein incorporated by reference in its entirety. However, these etching solutions can etch the copper surfaces more deeply than is desired.

Low metal etch depths are advantageous for at least three reasons. First, a low etch depth removes less metal from the surface thereby leaving more of the original metal cross section intact. This is particularly important for circuit traces with impedance or resistance tolerances which must be maintained since these properties are directly related to the cross sectional area of the circuit. Second, low metal etch depths allow the opportunity for reworking defective parts. Lastly, low metal etch depths reduce the rate at which metal builds up in the adhesion promoting composition. Since metal build up in the microetching composition has an effect upon the ultimate useable life of the composition, lower etch depths lead to an extended useable life for the microetching solutions in terms of the maximum square feet of metal processable per gallon of the microetching composition.

There remains a need in the art for improved microetching compositions that can provide the desired degree of microetching in a copper or copper alloy surface while overcoming some of the difficulties noted in the prior art.

To that end, the inventors of the present invention have discovered that a cupric ion-based microetching composition can be provided that reduces the degree of etching of the copper surface while providing a roughened surface with the desired surface attributes. The inventors of the present invention have discovered that the use of nitrites in the microetching composition, along with additional optional additives, provides beneficial results as compared to compositions of the prior art.

SUMMARY OF THE INVENTION

Figure 1A:
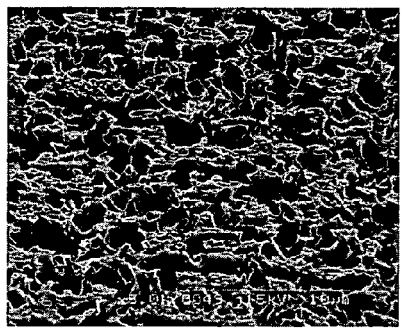
FIGS. 1A, 1B, and 1C depict Scanning Electron Microscope (SEM) images of microroughened surfaces prepared in accordance with the present invention using acetonitrile as the nitrile source.

The present invention is directed to an improved microetching composition and a method of using the same to provide surface roughness to copper and copper alloy surfaces, in order to improve the bonding strength between the copper or copper alloy surface and a resin composition applied thereon.

To that end, the present invention is directed to a microetching composition comprising:
a) a source of cupric ions;
b) acid;
c) a nitrile compound; and
d) a source of halide ions.

The present invention is also directed to a method of microetching copper or copper alloy surfaces to increase the adhesion of the copper surface to a polymeric material, the method comprising the steps of:
1) contacting a copper or copper alloy surface with the composition of the invention; and thereafter
2) bonding the polymeric material to the copper or copper alloy surface.

The inventors of the present invention have found that the foregoing composition significantly reduces the amount of copper etched during film formation as compared to prior art microetching compositions while maintaining good adhesion promotion. The process proposed is particularly suited to the production of multilayer printed circuit boards.

DETAILED DESCRIPTION OF THE PREFERRED EMBODIMENTS

The present invention is directed to an improved microetching composition comprising:
a) a source of cupric ions;
b) acid;

c) a nitrile compound; and d) a source of halide ions.

The cupric ion source has the function of an oxidizing agent to oxidize metals such as copper, copper alloys, etc. The use of the cupric ion source as the oxidizing agent ensures that the microetching composition exhibits an adequate etching rate and etching depth in the metal surface. Cupric chloride, cupric bromide, and cupric hydroxide are examples of cupric ions sources usable in the present invention. In a preferred embodiment, the cupric ion source is cupric chloride. The concentration of the source of cupric ions is typically about 10 g/l to 60 g/l, more preferably about 20 g/l to 50 g/l.

The acid is preferably an inorganic acid or organic acid selected from the group consisting of hydrochloric acid, sulfuric acid, phosphoric acid, nitric acid, formic acid, acetic acid, sulfanic acid, and toluene sulfonic acid although other acids would be known to one skilled in the art and would also be usable in the practice of the present invention. Suitable nitrile compounds include mononitriles, dinitriles, and multinitriles.

Suitable mononitriles are of the formula H—RCN, wherein R is a substituted or unsubstituted alkylene (preferably of 1 to 8 carbon atoms), a substituted or unsubstituted arylene (preferably benzene), or a substituted or unsubstituted alkylarylene (preferably of 7 to 12 carbon atoms). Larger R groups may have decreased solubility, have a tendency to leave a residue on the substrate, contribute fewer nitrile groups compared to the weight of material added, or otherwise be less suitable than the preferred smaller molecules. The substituted group or R could be a halogen, hydroxide, $NH_2$, COOH or a hetero cyclic group such as imidazole, pyridine and triazole. Preferred mononitriles include acetonitrile, propionitrile, isobutyronitrile, dicyanoamide, aminocronitrile, hydroxybutyronitrile, cyanoimidazole, and cyanopyridine. Acetonitrile is especially preferred.

Dinitriles are also suitable for use in the present invention. Suitable dinitriles are typically of the formula NC—R—CN where R is a substituted or unsubstituted alkylene (preferably of 1 to 8 carbon atoms), substituted or unsubstituted arylene (preferably benzene), or substituted or unsubstituted alkylarylene (preferably of 7 to 12 carbon atoms). By alkylarylene is meant aryl with one or more alkyl side chains and the two CN groups bonded either to the aryl, to the alkyl, or one to the aryl and one to the alkyl. Dinitriles with R groups larger than those indicated are less preferred for the reasons provided above in relation to larger mononitriles. The substituted R group could be halogen, hydroxide, $NH_2$, COOH, or a hetero cyclic group such as imidazole, pyridine, and triazole. Preferred dinitriles include malonitrile, succinonitrile, dicyanoimidazole, glutaronitrile, adiponitrile, and phthalonitrile. Adiponitrile is especially preferred.

Multinitriles are also suitable for use in the present invention. Multinitriles are typically chemicals having more than two cyano groups in one molecule. Suitable multinitriles include polyacrylnitrile and its copolymers. Preferred multinitriles include polyacrylnitrile and polyacrylnitrile-co-acrylic acid.

The concentration of the nitrile compound is about typically about 0.01% to 20% by weight, more preferably about 0.05% to 10% by weight.

The microetching composition also contains a source of halide ions, which are compounds that provide halide ions in the matrix of the microetching composition. The halide ions are used to assist in dissolving the metal (i.e. copper) and to ensure production of copper surfaces with superior adhesiveness and solderability. Fluoride ions, chloride ions, bromide ions, and the like can be used as the halide ion source, although chloride ions are generally preferred. The halide ions are added to the composition as a compound which can be dissociated into a halide ion in a solution. Examples of preferred sources of halide ions include alkaline metal salts such as sodium chloride, ammonium chloride, and potassium chloride, oxohalides such as sodium chlorate and potassium chlorate, halide bearing mineral acids such as hydrochloric acid, or copper chloride.

To optimize performance of the microetching composition, other additives may be included in the composition of the invention. These additives are typically selected from the group consisting of organic solvents, amines, polyamines, acrylamide and molybdenum ions.

Suitable organic solvents include butyl carbitol, diethylene glycol butyl ether, and propylene glycol. The organic solvents may also be used to dissolve solids that may precipitate out of the microetching compositions of the invention.

Suitable amines include N,N-diethylethanol amine, triethylene tetramine, gylcine, and ethylene diaminetetracetic acid. Suitable polyamines include P-400 (polyethyleneimine, Mn 423, available from Aldrich Chemical Co.).

Suitable sources of molybdenum ions include any molybdenum-containing ion soluble in the aqueous solution of the invention. Preferred sources of molybdenum ions are molybdate salts, such as sodium molybdate, and phosphomolybdic acid. Other suitable sources of molybdenum ions include molybdic acid, molybdic anhydride, and salts of phosphomolybidic acid.

The present invention is also directed to an improved method of microetching copper or copper alloy surfaces to increase the adhesion of the copper surface to a polymeric material, the method comprising the steps of:

1) contacting a copper or copper alloy surface with the composition of the invention; and thereafter 2) bonding the polymeric material to the copper or copper alloy surface.

While reference is made to copper surfaces, the metal surface to be treated may comprise a variety of metals such as copper, copper alloys, nickel and iron. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

The metal surface can be treated with the microetching composition in a variety of ways, including immersion, spray, or flood. The temperature of the adhesion-promoting composition during treatment may range from 80° F. to 150° F. but is preferably from 90° F. to 120° F. The treatment time will vary depending upon the temperature and method of treatment but may range from 15 seconds to 15 minutes and is preferably from 30 seconds to 2 minutes.

The following examples are illustrative of the invention but should not be taken as limiting:

EXAMPLE 1

Acetonitrile was tested as an additive in a conventional copper chloride/sodium chloride microetching system. The modified system had the following composition:

| | |
|---|---|
| Copper chloride | 43 g/l |
| Sodium chloride | 48 g/l |
| Acetonitrile | 200 g/l |
| Hydrochloric acid to a pH of 1.0 | |

The solution did not produce any better results than the conventional solution until a higher concentration of acetonitrile was used. At 200 ml/l of acetonitrile, a matte and brown surface was obtained with an etching depth of 170 microinches.

In order to reduce the etching depth, the concentration of copper chloride was reduced to 15 g/l from 43 g/l and no sodium chloride was added. The etching depth was thus reduced to about 59 microinches. A scanning electron microscope (SEM) image of the surface is provided in FIG. 1A.

Figure 1B:
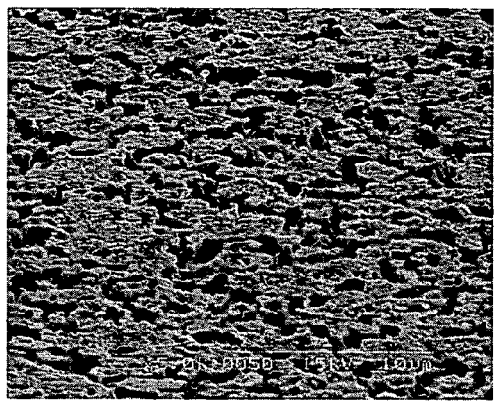
Figure 1C:
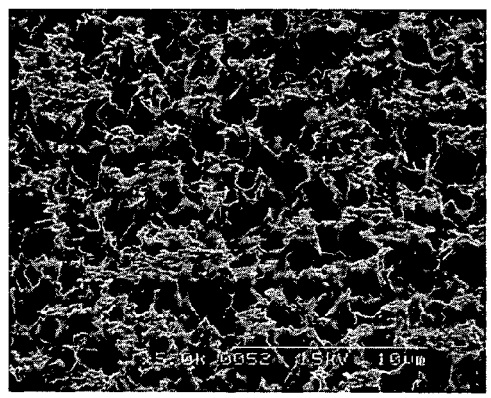

Copper was then loaded at 5.3 g/l in order to artificially age the solution. Sodium chloride was added to control the etching rate and hydrochloric acid was added to control pH. An etching depth of about 22 microinches was thus obtained. A SEM image of the surface is provided in FIG. 1B. Copper was also loaded at 6.1 g/l, and an etching depth of about 69 microinches was obtained. A SEM image of the surface is provided in FIG. 1C.

Thus, it can be seen that the addition of acetonitrile to the copper chloride microetching solution provided a beneficial result.

EXAMPLE 2

The effectiveness of adiponitrile in a copper chloride/sodium chloride microetching system was also tested in accordance with the invention, and the following solution was prepared:

| | |
|---|---|
| Copper chloride | 74 ml/l (43 g/l) |
| NaCl | 48 g/l |
| Adiponitrile | 2 ml/l |
| Hydrochloric acid to a pH of 1.0 | |

Figure 2A:
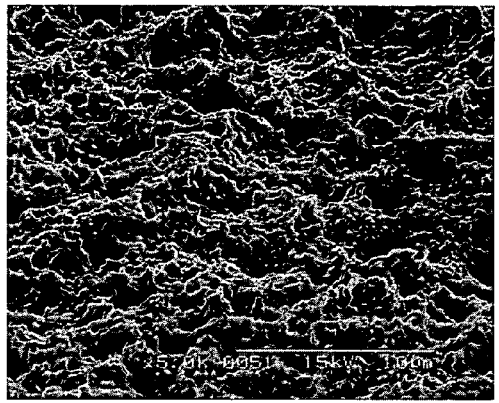
FIGS. 2A, 2B, 2C, and 2D depict SEM images of microroughened surfaces prepared in accordance with the present invention using adiponitrile as the nitrile source.

An etching depth of about 60 microinches was obtained and a SEM image of the surface is provided in FIG. 2A.

Figure 2B:
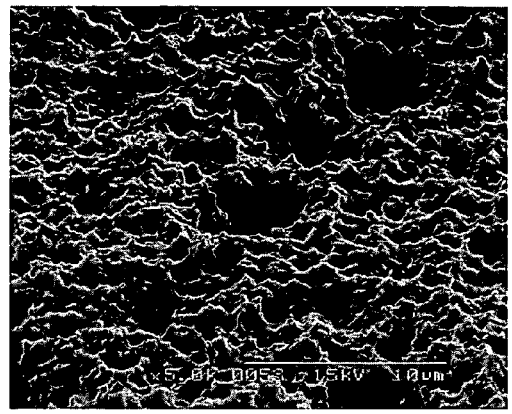

When P-400 (polyethylenimine, Mn-423) (available from Aldrich Chemical Company) was added to the composition, an etching depth of about 65 microinches was obtained. A SEM image of the surface is provided in FIG. 2B.

It was observed that solids formed in the solution after loading copper and a layer of yellow solid was present on the copper surface.

Butyl carbitol was used to dissolve the solid, and the following solution was prepared:

| | |
|---|---|
| Copper chloride | 74 ml/l |
| NH$_4$Cl | 44 g/l |
| Butyl carbitol | 200 ml/l |
| Adiponitrile | 2 ml/l |

Figure 2C:
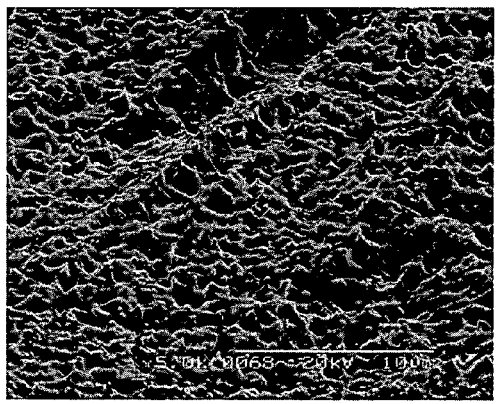
Figure 2D:
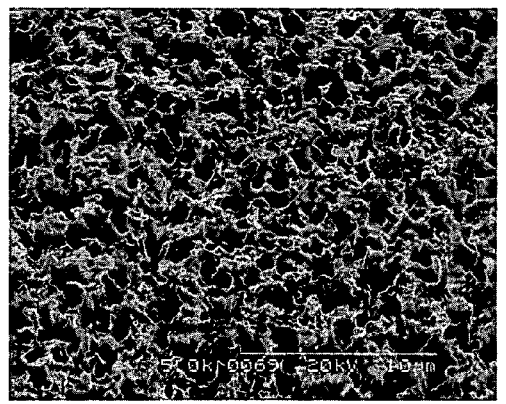

An initial etch depth of 81 microinches was obtained, and a SEM image of the surface is provided in FIG. 2C. Thereafter, copper was loaded at a concentration of 5.3 g/l and an etch depth of 75 microinches was obtained. A SEM image of the surface is provided in FIG. 2D.

The copper chloride concentration was reduced to about 36 ml/l (21.5 g/l) and the concentration of butyl carbitol concentration was reduced to about 100 ml/l (97 g/l). The solution showed similar etching properties. 10 g/l of copper was loaded, and a small amount of crystal formed overnight, which was dissolved by adding an addition 50 ml/l of butyl carbitol.

Thus, it can be seen that the addition of nitrile compounds to copper chloride microetching solutions provides a beneficial result as compared to the prior art.

What is claimed is:

1. A microetching composition for treating metal surfaces consisting essentially of:
   a) a source of cupric ions;
   b) acid;
   c) a nitrile compound; and
   d) a source of halide ions.

2. The microetching composition according to claim 1, wherein the source of cupric ions comprises copper chloride.

3. The microetching composition according to claim 1, wherein the acid comprises an acid selected from the group consisting of hydrochloric acid, sulfuric acid, phosphoric acid, nitric acid, formic acid, acetic acid, sulfamic acid and toluene sulfonie acid.

4. The microetching composition according to claim 1, further comprising an organic solvent selected from the group consisting of butyl carbitol, diethylene glycol butyl ether, propylene glycol, and combinations of the foregoing.

5. The microetching composition according to claim 4, wherein the organic solvent comprises butyl carbitol.

6. The microetching composition according to claim 1, further comprising a source of molybdenum ions.

7. The microetching composition according to claim 6, wherein the source of molybdenum ions comprises an additive selected from the group consisting of sodium molydate, phosphomolybdie acid, molybdic acid, molybdic anhydride, and salts of phosphomolybdic acid.

8. The microetching composition according to claim 1, wherein the nitrile compound comprises a nitrile compound selected from the group consisting of acetonitrile, propionitrile, isobutyronitrile, adiponitrile, malonitrile, glutaronitrile, phthalonitrile, dicyanoamide, aminoeronitrile, hydroxybutyronitrile, cyanoimidazole, cyanopyridine, polyacrylnitrile copolymers, and combinations of the foregoing.

9. The microetching composition according to claim 8, wherein the nitrile compound comprises acetonitrile.

10. The microetching composition according to claim 8, wherein the nitrile compound comprises adiponitrile.

11. The microetching composition according to claim 1, wherein the concentration of the source of cupric ions is about 10 to about 60 g/l.

12. The microetching composition according to claim 9, wherein the concentration of the source of the cupric ions is about 20 to about 50 g/l.

13. The microetching composition according to claim 1, wherein the concentration of the nitrile compound is about 0.01% to 20% by weight.

14. The microetching composition according to claim 1, futher comprising an amine.

15. The microetching composition according to claim 12, wherein the amine comprises an amine selected from the group consisting of N,N-diethylethanolamine, triethylene tetramine, glycine, and ethylene diamine tetraacetic acid.

16. The microetching composition according to claim 1, further comprising a polyamine.

17. The microetching composition according to claim 1, further comprising an acrylamide.

18. A method of microetching a metal surface to increase the adhesion of a polymeric material to the metal surface, the method comprising the steps of:
   a) contacting the metal surface with a microetching composition consisting essentially of:
      i) a source of cupric ions;
      ii) acid acid;

iii) a nitrite compound; and
iv) a source of halide ions; and thereafter
b) bonding the polymeric material to the metal surface.

19. The method according to claim 18, wherein the step of contacting the metal surface with the microetching composition is accomplished by spraying, immersion, or flooding.

20. The method according to claim 18, wherein the source of cupric ions comprises copper chloride.

21. The method according to claim 18, wherein the acid comprises an acid selected from the group consisting of hydrochloric acid, sulfuric acid, phosphoric acid, nitric acid, formic acid, acetic acid, sulfamic acid, and toluene sulfonic acid.

22. The method according to claim 18, wherein the microetching composition further comprises an organic solvent selected from the group consisting of butyl carbitol, diethylene glycol butyl ether, propylene glycol, and combinations of the foregoing.

23. The method according to claim 22, wherein the organic solvent comprises butyl carbitol.

24. The method according to claim 18, wherein the microetching composition further comprises a source of molybdenum ions.

25. The method according to claim 24, wherein the source of molybdenum ions comprises an additive selected from the group consisting of sodium molybdate, phosphomolybdic acid, molybdic acid, molybdic anhydride, and salts of phosphomolybdic acid.

26. The method according to claim 18, wherein the nitrile compound comprises selected from the group consisting of acetonitrile, propionitrile, isobutyronitrile, adiponitrile, malonitrile, glutaronitrile, phthalonitrile, dicyanoamide, aminocronitrile, hydroxybutyronitrile, cyanoimidazole, cyanopyridine, polyacrylnitrile, polyacryl nitrile copolymers and combinations of the foregoing.

27. The method according to claim 26, wherein the nitrile compound comprises acetonitrile.

28. The method according to claim 26, wherein the nitrile compound comprises adiponitrile.

29. The method according to claim 18, wherein the microetching composition further comprises an amine.

30. The method according to claim 29, wherein the amine comprises an amine selected from the group consisting of N-N-diethyiethanol amine, triethylene tetraamine, glycine and ethylene diamine tetraacetic acid.

31. The method according to claim 18, wherein the microetching composition further comprises a polyamine.

32. The method according to claim 18, wherein the microetching composition further comprises an acrylamide.

* * * * *

UNITED STATES PATENT AND TRADEMARK OFFICE
CERTIFICATE OF CORRECTION

PATENT NO. : 7,456,114 B2
APPLICATION NO. : 11/316010
DATED : November 25, 2008
INVENTOR(S) : Kesheng Feng et al.

It is certified that error appears in the above-identified patent and that said Letters Patent is hereby corrected as shown below:

Column 6, Line 29 Claim 7, delete "phosphomolybdie" and replace it with --phosphomolybdic--

Column 6, Line 35 Claim 8, delete "aminoeronitrile" and replace it with --aminocronitrile--

Column 6, Line 67 Claim 18, delete "acid acid;" and replace it with --acid;--

Column 7, Line 1 Claim 18, delete "nitrite" and replace it with --nitrile--

Signed and Sealed this

Seventeenth Day of February, 2009

JOHN DOLL
*Acting Director of the United States Patent and Trademark Office*